(12) United States Patent
Noguchi

(10) Patent No.: US 11,475,929 B2
(45) Date of Patent: Oct. 18, 2022

(54) MEMORY REFRESH

(71) Applicant: Taiwan Semiconductor Manufacturing Company, Ltd., Hsinchu (TW)

(72) Inventor: Hiroki Noguchi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/118,843

(22) Filed: Dec. 11, 2020

(65) Prior Publication Data

US 2021/0272609 A1  Sep. 2, 2021

Related U.S. Application Data

(60) Provisional application No. 62/982,345, filed on Feb. 27, 2020.

(51) Int. Cl.
*G11C 7/10* (2006.01)
*G06F 11/10* (2006.01)
*G11C 7/06* (2006.01)

(52) U.S. Cl.
CPC ........ *G11C 7/1051* (2013.01); *G06F 11/1068* (2013.01); *G11C 7/06* (2013.01); *G11C 7/1096* (2013.01)

(58) Field of Classification Search
None
See application file for complete search history.

(56) References Cited

U.S. PATENT DOCUMENTS

| 6,101,614 | A  | * | 8/2000  | Gonzales ............... G06F 11/106 |
|           |    |   |         | 710/39 |
| 7,676,728 | B2 |   | 3/2010  | Resnick et al. |
| 7,797,610 | B1 | * | 9/2010  | Simkins ................. G11C 29/52 |
|           |    |   |         | 714/763 |
| 8,069,377 | B2 |   | 11/2011 | Singh |
| 8,359,517 | B2 |   | 1/2013  | Pawlowski |
| 10,360,987 | B2 |   | 7/2019  | Shin et al. |
| 10,372,544 | B2 |   | 8/2019  | Ishikawa |
| 10,553,285 | B2 | * | 2/2020  | Zamir ................. G06F 11/1068 |
| 2012/0155173 | A1 |   | 6/2012  | Lee et al. |
| 2018/0322939 | A1 |   | 11/2018 | Glancy et al. |

FOREIGN PATENT DOCUMENTS

KR  2002-0013798 A  2/2002

* cited by examiner

*Primary Examiner* — Douglas King
(74) *Attorney, Agent, or Firm* — Merchant & Gould P.C.

(57) ABSTRACT

Performing refresh operation in a memory device is provided. A refresh operation without address rotation is performed in a cell array of the memory device. Performing the refresh operation without address rotation is repeated for a predetermined number of times. After repeating performing the refresh operation with address rotation for the predetermined number of times, a refresh operation with address rotation is performed in the cell array.

20 Claims, 7 Drawing Sheets

MEMORY REFRESH

CROSS-REFERENCE TO RELATED APPLICATION

This application claims priority to U.S. Provisional Patent Application No. 62/982,345, filed Feb. 27, 2020, the disclosure of which is hereby incorporated by reference in its entirety.

BACKGROUND

Semiconductor memory are utilized extensively as a storage medium for digital devices such as personal computers, cellular telephones, personal data assistants, and other similar products. Digital information in the unit of one bit is stored in a two dimensional array of bit cells or memory cells. For example, one megabit memory device includes an array of 1024×1024 memory cells. A single memory cell within the example one megabit memory device can be selected by a 10-bit row address and a 10-bit column address.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
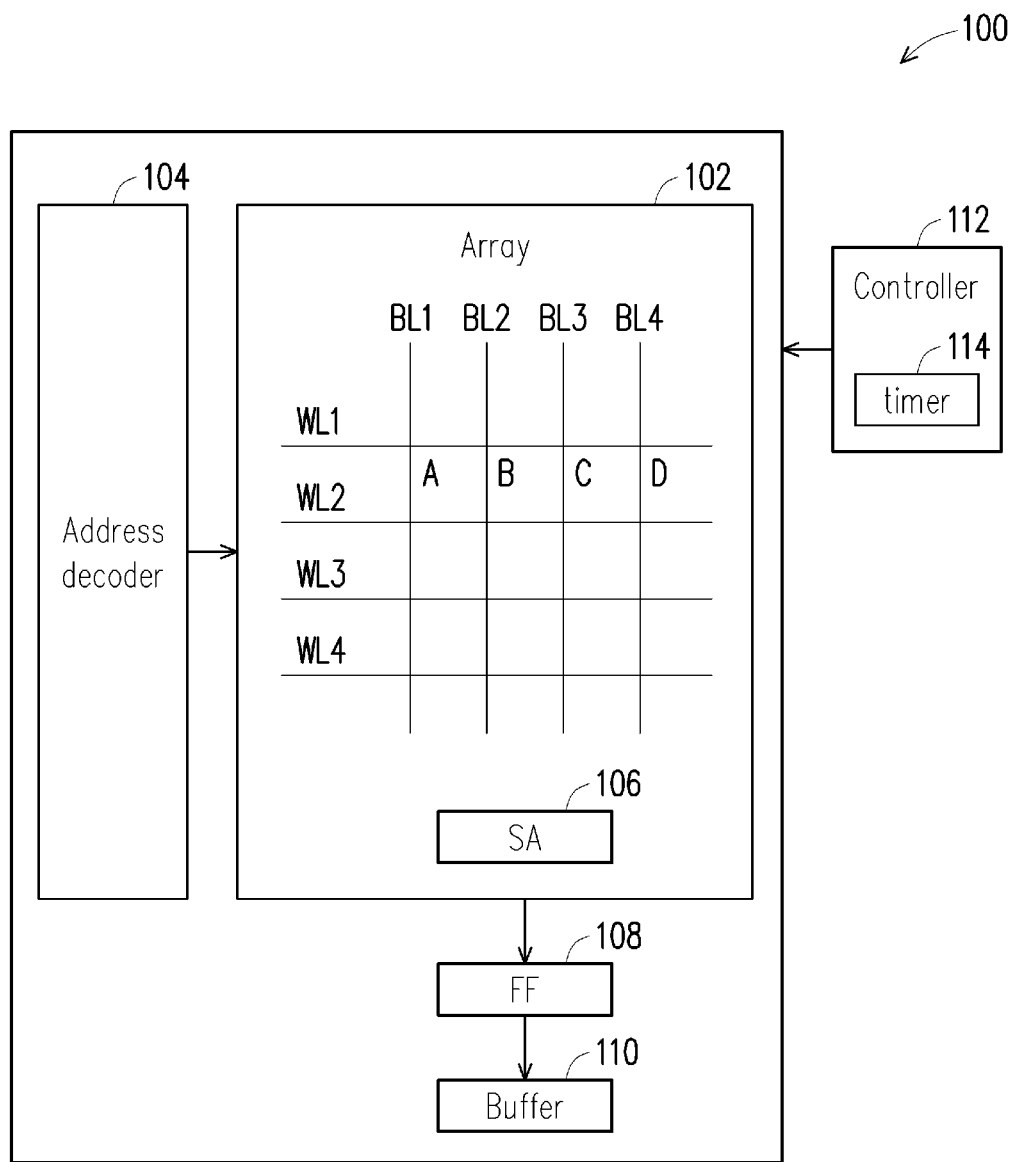
FIG. 1 is a diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices are used to store information in semiconductor devices and systems. A dynamic random access memory (DRAM) cell includes a switch and a capacitor. DRAMs do not retain data when power is cut off. A nonvolatile memory device is capable of retaining data even after power is cut off. Examples of nonvolatile memory devices include a flash memory, magnetic random access memories (MRAMs), ferroelectric random access memories (FRAMs), resistive random access memories (RRAMs), and phase-change random access memories (PRAMs). MRAMs, FRAMs, RRAMs, and PRAMs are sometimes referred to as "emerging memories". MRAMs store data using variations in the magnetization direction at tunnel junctions. FRAMs store data using polarization characteristics of ferroelectricity. RRAMs store data using variations in resistance of a resistive material layer. PRAMs store data using resistance variations caused by phase changes of specific materials.

Digital information stored in a memory may get corrupted due to various reasons. One possible cause of the corruption is due to environmental events both internal to the memory and outside of the memory. One such outside event is a particle strike. There are other reasons which cause the corruption (failure) of bits besides environmental events. Data errors, such as, soft errors, that are not permanent or representative of physical damage to the device may result from disturb errors, radiation effects, or thermal effects, among others. When a bit is corrupted, information stored is lost resulting in a system failure or data loss.

The disclosure provides a memory refresh operation to maintain the accuracy of the stored information. The memory refresh operation or simply refresh operation is a process of periodically reading data from an area of the memory, checking the data for an error, correcting the error (if detected), and re-writing the data. Each memory refresh cycle refreshes a succeeding area of the memory, thus repeatedly refreshing all the cells in a consecutive cycle. Generally, while the refresh operation is occurring the memory may not be available for normal read and write operation.

The disclosure further provides an optimized refresh operation in accordance with some embodiments. For example, the disclosed techniques provide for refresh operations with and without address rotation. In a refresh operation without address rotation, a data stored in a cell is read, checked for an error, and is written back (or re-written) to the same cell. In a refresh operation with address rotation, the data read from one cell is re-written to another cell, and a data address for the read data is updated to point to the another cell when the read data is re-written. Since, in the refresh operation with the address rotation, the data is re-written to different cells and the address is rotated accordingly when the refresh operation is performed, the write times of memory cells of the memory device is averaged. In example embodiments and discussed in detail in the following sections of the disclosure, the refresh operation with address rotation and the refresh operation without address rotation are performed in a coordinated manner (that is, in a predetermined sequence and at a predetermined frequency) to minimize a number of re-writes for the memory device and to optimize resource utilization for the refresh operation.

FIG. 1 illustrates a memory device 100 in accordance with some embodiments. In some examples, memory device 100 is a nonvolatile memory device capable of retaining data even after power is cut off. For example, memory device 100 can include a flash memory, MRAMs, FRAMs, RRAMs, and PRAMs. MRAMs store data using variations in the magnetization direction at tunnel junctions. FRAMs store data using polarization characteristics of ferroelectricity. RRAMs store data using variations in resistance of a resistive material layer. PRAMs store data using resistance variations caused by phase changes of specific materials. However, it will be apparent to a person with ordinary skill in the art after reading this disclosure that other types of memory devices are within the scope of the disclosure.

As shown in FIG. 1, memory device 100 includes a cell array 102, an address decoder 104, a sense amplifier 106, a flip-flop 108, a buffer 110, and a controller 112. Controller 112 further includes a timer 114. It will be apparent to a person with an ordinary skill in the art after reading this disclosure that memory device 100 can include additional components than those shown in FIG. 1. In addition, it will be apparent to a person with an ordinary skill in the art after reading this disclosure that memory device 100 can include fewer components than those shown in FIG. 1.

Cell array 102 includes a plurality of cells arranged in a matrix of a plurality of rows and a plurality of columns. For example, one megabit memory device includes a cell array having 1024 rows and 1024 columns, and, therefore, 1024× 1024 cells. Each of the plurality of cells are configured to store a bit logic "0" or "1" value of data therein. Each of the plurality of rows is associated with a word line (for example, WL1, WL2, WL3, WL4, etc.). Moreover, each of the plurality of rows includes a first plurality of cells (cell A, cell B, cell C, cell D, etc.) of the plurality of cells. Each of the first plurality of cells of the each of a row of the plurality of rows is connected to an associated word line (that is, one of WL1, WL2, WL3, WL4, etc.). Similarly, each of the plurality of columns of cell array 102 is associated with a bit line (that is, BL1, BL2, BL3, BL4, etc.). Moreover, each of the plurality of columns include a second plurality of bit cells of the plurality of bit cells. Each of the second plurality of bit cells of a column of the plurality of columns is connected to an associated bit line (that is, one of BL1, BL2, BL3, BL4, etc.).

Address decoder 104 is connected to cell array 102. Address decoder 104 is operative to select one of the plurality of word lines (that is, one of WL1, WL2, WL3, WL4, etc.) and charge the selected word line to a predetermined voltage level for read and write operation on the first plurality of cells associated with the selected word line. A single memory cell within the example one megabit memory device with 1024×1024 cells can be selected by a 10-bit row address and a 10-bit column address. In some examples, address decoder 104 is also referred to as word line driver.

Sense amplifier 106 is connected to cell array 102 and is operative to read data from or write data into cell array 102. For example, sense amplifier 106 is operative to sense a current in a bit line and compare the sensed current with a reference current to read data from or write data into cell array 102. Sense amplifier 106 can be associated with a predetermined number of bit lines (for example, four bit lines, eights bit lines, etc.). The predetermined number of bit lines associated with each sense amplifier 108 is also referred to as a word. Flip-flop 108 is connected to sense amplifier 106 and is operative to keep data read from cell array 102 or data to be written into cell array 102. Buffer 110 is operative to temporarily store data associated with cell array 102. Although memory device 100 of FIG. 1 is shown to include only one sense amplifier, it will be apparent to person with the ordinary skill in the art that memory device 100 can include more than one sense amplifier and flip-flop.

Controller 112 is connected to cell array 102 and is operative to perform refresh operations for cell array 102. For example, controller 112 initiates and performs refresh operation on cell array 102. Controller 112 repeats the refresh operation after a predetermined time period. For example, controller 112 repeats the refresh operation after every 20 milliseconds, 200 milliseconds, 2 seconds, etc. The predetermined time period for the refresh operation is provided by timer 114. Controller 112 may include a storage device to store instructions for the refresh operation and one or more processors to execute the stored instructions to perform and manage the refresh operation. The storage device to store the instructions can include a non-transistor computer readable medium.

In example embodiments, controller 112 may be in the form of a separate chip. In one example, controller 112 is integrated with memory device 100. In another example, controller 112 is implemented on a motherboard or form an integrated memory controller (IMC) on the microprocessor to potentially reduce memory latency. Controller 112 includes among other things, an error correcting code (ECC) circuit (not shown). The ECC circuit is configured to perform error check on data stored in cell array 102. For example, the ECC circuit is configured to detect and correct errors the data stored in the plurality of cells of cell array 102. In some examples, the ECC circuit can include an error detection module to detect the errors and an error correction module to correct the detected errors.

Figure 2:
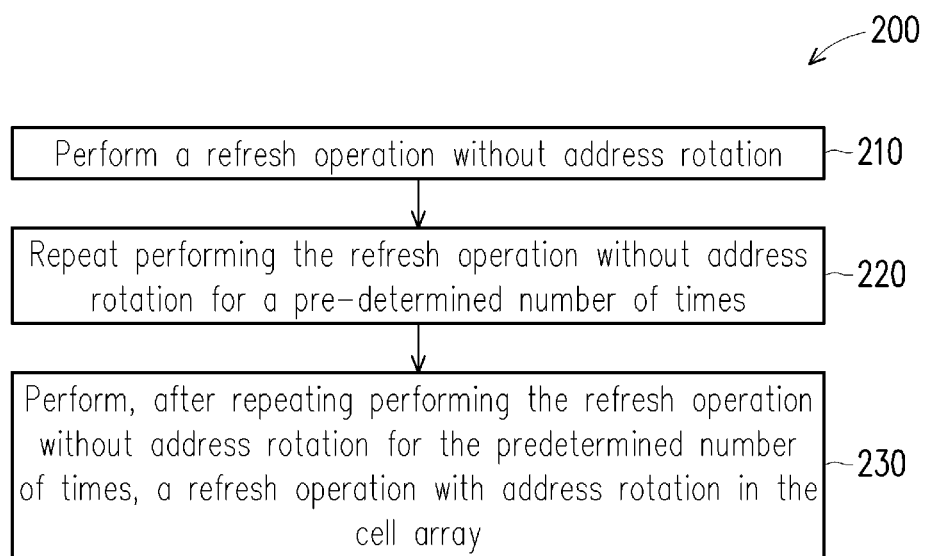
FIG. 2 is a flow diagram of a method for performing a refresh operating in a memory device in accordance with some embodiments.

FIG. 2 is a flow diagram of a method 200 for performing refresh operations in memory device 100 in accordance with some embodiments. The refresh operations are performed to correct errors in stored information in memory device 100. In some examples, method 200 is performed by controller 112 or a processing system described with reference to FIG. 6 of the disclosure. In other examples, method 200 can be stored as instructions in a storage device accessible to controller 112 or a processor. The stored instructions can be executed by controller 112 or the processor to perform method 200. The storage device to store the instructions can include a non-transistor computer readable medium.

At block 210 of method 200, a refresh operation without address rotation is performed. For example, the refresh operation without address rotation is performed in cell array 102 or a portion of cell array 102 of memory device 100. The refresh operation without address rotation can performed for each of the plurality of cells of cell array 102 or a portion of the plurality of cells of cell array 102. In examples, controller 112 or a processor is operative to perform the refresh operation without address rotation in cell array 102. The refresh operation without address rotation is discussed in a greater detail with reference to FIG. 3 of the disclosure.

At block 220 of method 200, performing the refresh operation without address rotation is repeated for a predetermined number of times. For example, the refresh operation without address rotation is repeated for three times, five times, ten times, fifteen times, twenty times, etc. A number of repetitions can be predetermined and modified during the refresh operation. In some examples, controller 112 or a processor is operative to repeat performing the refresh operation without address rotation in cell array 102. For example, controller 112 can be configured to repeat the refresh operation without operation for a predetermined number of times in cell array 102.

At block 230 of method 200, after repeating performing the refresh operation without address rotation for the predetermined number of times, a refresh operation with address rotation is performed. For example, the refresh operation with address rotation is performed in the cell array 102 or a portion of cell array 102 after repeating the refresh operation without address rotation for five times, ten times, twenty times, etc. In examples, controller 112 or a processor is operative to performing the refresh operation with address rotation in cell array 102. The refresh operation with address rotation is discussed in a greater detail with reference to FIG. 4 of the disclosure.

Although method 200 illustrates performing the refresh operation with address rotation after performing the refresh operation without address rotation for a predetermined number of times, it will be apparent to a person with ordinary skill in the art after reading this disclosure that the refresh operation with address rotation can be performed without performing the refresh operation without address rotation. That is, the refresh operation with address rotation can be performed independent of the refresh operation without address rotation to correct errors in stored information in memory device 100. Similarly, the refresh operation without address rotation can be performed independent of the refresh operation with address rotation to correct errors in stored information in memory device 100.

Figure 3:
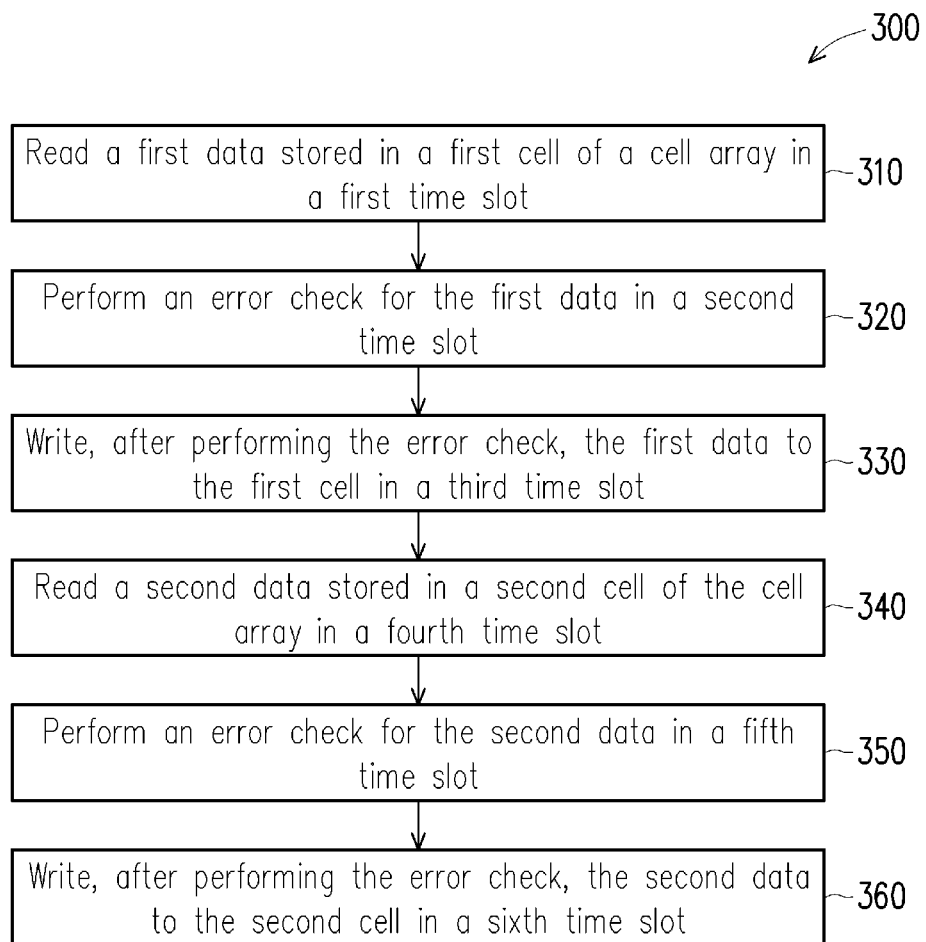
FIG. 3 is a flow diagram of a method for performing a refresh operation without address rotation in accordance with some embodiments.

FIG. 3 is a flow diagram 300 of a method for performing a refresh operating without address rotation in a memory device in accordance with some embodiments. The refresh operation without address rotation is performed to correct errors in stored information in memory device 100. In the refresh operation without address rotation, a data stored in a cell is read, checked for an error, and is written back (or re-written) to the same cell. In some examples, method 300 can be performed by controller 112 or a processing system described with reference to FIG. 6 of the disclosure. In other examples, method 300 can be stored as instructions in a storage device accessible to controller 112 or a processor. The stored instructions can be executed by controller 112 or the processor to perform method 300. The storage device to store the instructions can include a non-transistor computer readable medium.

At block 310 of method 300, a first data stored in a first cell is read. The first data is read in a first time slot. For example, a first data stored in cell A of cell array 102 of memory device 100 is read in the first time slot. In examples, address decoder 104 selects and charges first word line (WL1) and sense amplifier 106 reads the first data from the cell A using the bit line BL1. Sense amplifier 106 provides the first data to flip flop 108.

At block 320 of method 300, an error check is performed for the first data. During the error check it is determined whether the first data is corrupted. If the first data is found to be corrupted, the first data is corrected. In example embodiments, error correction code (ECC) scheme is used for performing the error check. The error check is performed by the ECC circuit of controller 112. The error check for the first data is performed in a second time slot. The second time slot follows the first time slot. For example, the second time slot is a next time slot after the first time slot.

In example embodiments, the ECC scheme encodes data by generating ECC check bits, e.g., redundancy bits or parity bits, which are stored along with the data in memory device 100. Data bits and check (e.g., parity) bits together form a codeword. For example, an ECC that generates 8 parity bits for 64 bits of data can usually detect two bit errors and correct one bit error in the 64 bits of data, known as a DED/SEC code, meaning double-error detecting (DED) and single-error correcting (SEC). However, it will be apparent to person with an ordinary skill in the art after reading this disclosure that other error correcting schemes, such as, single-error detecting (SED) and single-error correcting (SEC), single-error detecting (SED) and double-error correcting (DEC), double-error detecting (DED) and double-error correcting (DEC), triple-error detecting (TED) and triple-error correcting (TEC), etc., may be employed.

At block 330 of method 300, after performing the error check, the first data is written back to the first cell. For example, the first data is re-written in the cell A of cell array 102. The process of re-writing corrects the first data stored in the cell A of cell array 102. The first data is re-written in the cell A in a third time slot. The third time slot follows the second time slot. For example, the third time slot is a next time slot after the second time slot.

Steps of blocks 310, 320, and 330 are repeated for every cell connected to the first word line WL1 associated with sense amplifier 106. For example, at block 340 of method 300, a second data stored in a second cell connected to the first word line WL1 is read in a fourth time slot. That is, a second data stored in a cell B of cell array 102 is read in the fourth time slot. In examples, sense amplifier 106 reads the second data from the cell B. Sense amplifier 106 provides the first data to flip flop 108. The fourth time slot follows the third time slot. For example, the fourth time slot is a next time slot after the third time slot.

At block 350 of method 300, an error check is performed for the second data read from the cell B. The error check includes determining an error (if any) with the second data and correcting the error (if any). The error check is performed by the ECC circuit of controller 112. The error check for the second data is performed in a fifth time slot. The fifth time slot follows the fourth time slot. For example, the fifth time slot is a next time slot after the fourth time slot.

At block 360 of method 300, after performing error check for the second data, the second data is re-written in the second cell. For example, the second data is re-written in the cell B of cell array 102. The process of re-writing corrects the second data stored in the cell B of cell array 102. The second data is re-written in the cell B in a sixth time slot. The sixth time slot follows the fifth time slot. For example, the sixth time slot is a next time slot after the fifth time slot.

In example embodiments, method 300 continues to read data stored in the cell C and the cell D, perform error check checked for the data, and re-write the data back to the cell C and cell D respectively in consecutive time slots (not shown) associated with the first word line WL1 and sense amplifier 106. After performing the refresh operation without address rotation for the cell A, cell B, cell C, and cell D, method 300 proceeds to perform the refresh operation without address rotation for cells associated with the first word line WL1 and another sense amplifier, then to cells connected to the second word line WL2 and sense amplifier 106, and so on. In example embodiments, an extent or coverage of is predetermined and controlled by controller 112. In addition, the refresh operation without address rotation for cell array 102 is repeated after an expiry of timer 114. Hence, a sequence of performing the refresh operation without address rotation is configurable and is controlled by controller 112. In addition, a frequency of performing the refresh operation without address rotation is also configurable and is controlled by controller 112.

Figure 4:
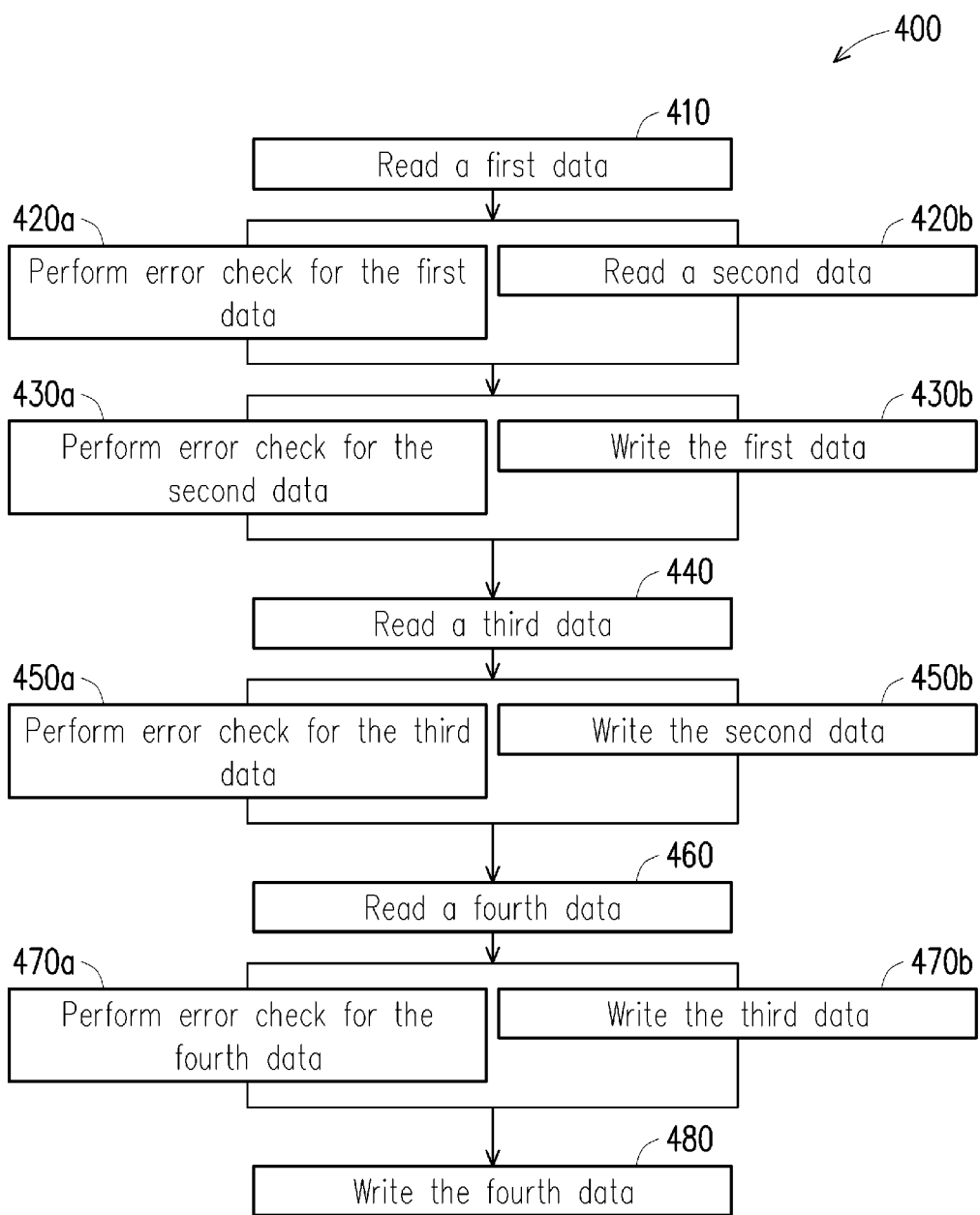
FIG. 4 is a flow diagram illustrating a method for performing a refresh operation with address rotation in accordance with some embodiments.

FIG. 4 is a flow diagram of a method 400 for performing a refresh operating with address rotation in memory device 100 in accordance with some embodiments. The refresh operation with the address rotation is performed to correct errors in stored information in memory device 100. In the refresh operation with address rotation, the data read from one cell is re-written to another cell, and a data address for the read data is updated to point to the another cell when the read data is re-written. In some examples, method 400 can be performed by controller 112 or a processing system described with reference to FIG. 6 of the disclosure. In other examples, method 400 can be stored as instructions in a storage device accessible to controller 112 or a processor. The stored instructions can be executed by controller 112 or the processor to perform method 400. The storage device to store the instructions can include a non-transitory computer readable medium.

At block 410 of method 400, a first data is read. The first data is read from a first cell of cell array 102 and is read in a first time slot. For example, the first data stored in a first cell (that is, the cell A) connected to the first word line (that is, the WL1) and a first bit line (that is, BL1) of cell array 102 is read in the first time slot. The first time slot is approximately equal to a clock cycle. The first data is read by sense amplifier 106 and is provided in flip flop 108.

At block 420a of method 400, an error check for the first data is performed. The error check includes determining whether the first data is corrupted. If the first data is found to be corrupted, the first data is corrected. The error check is performed by the ECC circuit of controller 112. In example embodiments, the first data, after performing the error check, is stored in buffer 110. The error check for the first data is performed in a second time slot. The second time slot follows the first time slot. For example, the second time slot is a next time slot after the first time slot.

In example embodiments, error correction code (ECC) scheme is used for performing the error check. The ECC scheme encodes data by generating ECC check bits, e.g., redundancy bits or parity bits, which are stored along with the data in memory device 100. Data bits and check (e.g., parity) bits together form a codeword. For example, an ECC that generates 8 parity bits for 64 bits of data can usually detect two bit errors and correct one bit error in the 64 bits of data, known as a DED/SEC code, meaning double-error detecting (DED) and single-error correcting (SEC).

At block 420b of method 400, a second data is read. The second data is read from a second cell of cell array 102 in a second time slot. For example, the second data stored in a second cell (that is, the cell B) connected to the first word line (that is, WL1) and a second bit line (that is, BL2) of cell array 102 of memory device 100 is read in the second time slot. That is, the second data is read substantially simultaneously with performing the error check for the first data in the second time slot. Stated another way, the second data is read in parallel with performing the error check for the first data in the second time slot. The second time slot follows the first time slot. For example, the second time slot is a next time slot after the first time slot. The second data is read by sense amplifier 106 and provided to flip flop 108.

At block 430a of method 400, an error check for the second data is performed. The error check includes determining whether the second data is corrupted. If the second data is found to be corrupted, the second data is corrected. The error check is performed by the ECC circuit of controller 112. In example embodiments, the second data, after performing the error check, is stored in buffer 110. The error check for the second data is performed in a third time slot. The third time slot follows the second time slot. For example, the third time slot is a next time slot after the second time slot.

At block 430b of method 400, the first data is written. In example embodiments, the first data is written back in another cell of cell array 102. For example, the first data is written in the second cell (that is, the cell B) of cell array 102. The process of re-writing the first data corrects the first data. After writing the first data to the second cell (that is, the cell B), an address for the first data is rotated to the second cell (that is, to the cell B). In some examples, the first data can be written to the cell C or the cell D which are associated with the first word line WL1 and sense amplifier 106. The first data is written to the second cell (that is, the cell B) by sense amplifier 106 from buffer 110. The first data is written substantially simultaneously with performing the error check for the second data in the third time slot. Stated another way, the first data is written in parallel with performing the error check for the second data in the third time slot. The third time slot follows the second time slot. For example, the third time slot is a next time slot after the second time slot.

At block 440 of method 400, a third data is read. The third data is read from a third cell of cell array 102 in a fourth time slot. For example, the third data stored in a third cell (that is, the cell C) connected to the first word line (that is, the WL1) and a third bit line (that is, BL3) of cell array 102 is read in the fourth time slot. The fourth time slot follows the third time slot. The fourth time slot is approximately equal to a clock cycle. The third data is read by sense amplifier 106 and is provided in flip flop 108.

At block 450a of method 400, an error check for the third data is performed. The error check includes determining whether the third data is corrupted. If the third data is found to be corrupted, the third data is corrected. The error check is performed by the ECC circuit of controller 112. The third data, after performing the error check, is stored in buffer 110. The error check for the third data is performed in a fifth time slot. The fifth time slot follows the fourth time slot. For example, the fifth time slot is a next time slot after the fourth time slot.

At block 450b of method 400, the second data is written. In example embodiments, the second data is written in another cell of cell array 102. For example, the second data is written in the third cell (that is, the cell C) of cell array 102. The process of re-writing the second data corrects the second data. After writing the second data to the third cell, an address for the second data is rotated to the third cell. In some examples, the second data can be written to the cell D instead of the cell C. The second data is written to the third cell (that is, the cell C) by sense amplifier 106 from buffer 110. In example embodiments, the second data is written substantially simultaneously with performing the error check for the third data in the fifth time slot. Stated another way, the second data is written in parallel to performing the error check for the third data in the fifth time slot.

At block 460 of method 400, a fourth data is read. The fourth data is read from a fourth cell of cell array 102 in a sixth time slot. For example, the fourth data stored in a fourth cell (that is, the cell D) connected to the first word line (that is, WL1) and a fourth bit line (that is, BL4) of cell array 102 of memory device 100 is read. The fourth data is read by sense amplifier 106 and provided to flip flop 108. The fourth data is read in the sixth time slot. The sixth time slot follows the fifth time slot. For example, the sixth time slot is a next time slot after the fifth time slot.

At block 470a of method 400, an error check for the fourth data is performed. The error check includes determining whether the fourth data is corrupted. If the fourth data is found to be corrupted, the fourth data is corrected. The error check is performed by the ECC circuit of controller 112. The fourth data, after performing the error check, is stored in buffer 110. The error check for the fourth data is performed in a seventh time slot. The seventh time slot follows the sixth time slot. For example, the seventh time slot is a next time slot after the sixth time slot.

At block 470b of method 400, the third data is written. In example embodiments, the third data is written in another cell of cell array 102. For example, the third data is written in the fourth cell (that is, the cell D) of cell array 102. The process of re-writing the third data corrects the third data. After writing the third data to the fourth cell, an address for the third data is rotated to the fourth cell. The second data is written to the fourth cell (that is, the cell D) by sense amplifier 106 from buffer 110. In example embodiments, the third data is written substantially simultaneously with performing the error check for the fourth data in the seventh time slot. Stated another way, the third data is written in parallel to performing the error check for the fourth data in the seventh time slot.

At block 480 of method 400, the fourth data is written. In example embodiments, the fourth data is written back in another cell of cell array 102. For example, the fourth data is re-written in the first cell (that is, the cell A) of cell array 102. The process of re-writing the fourth data corrects the fourth data. After writing the fourth data to the first cell, an address for the fourth data is rotated to the first cell. The fourth data is written to the first cell (that is, the cell A) by sense amplifier 106 from buffer 110. The fourth data is re-written in an eighth time slot. The eighth time slot follows the seventh time slot. For example, the eighth time slot is a next time slot after the seventh time slot.

Hence, in example embodiments, using method 400, that is, the refresh operation with address rotation, cells connected to the first word line (that is, WL1) and sense amplifier 106 (that is, the cell A, the cell B, the cell C, and the cell D) are refreshed in fewer number of time slots compared to using method 300, that is, the refresh operation without address rotation. In addition, in the refresh operation with address rotation, since the stored data is rotated to a different cell with each refresh operation, the same stored data is not corrupted multiple times because of a faulty cell. This reduces a number of re-writes for cell array 102 thereby improving resource utilization for the refresh operation.

In example embodiments, after performing the refresh operation with address rotation for the cell A, cell B, cell C, and cell D, method 400 proceeds to perform the refresh operation with address rotation for other cells of cell array 102. For example, method 400 proceeds to perform the refresh operation with address rotation for a next set of cells connected to the second word line (that is, WL2), a next set of cells connected to the first word line (that is, WL1) and another sense amplifier, and so on. In examples, a sequence of performing the refresh operation with address rotation can be predetermined and can be controlled by controller 112. In addition, a frequency of performing the refresh operation without address rotation can also be predetermined and controlled by controller 112. For example, the refresh operation with address rotation for the plurality of cells of cell array 102 is repeated at an expiry of timer 114. In some examples, the refresh operation with address rotation is performed after performing a predetermined number of the refresh operation without address rotation.

Figure 5A:
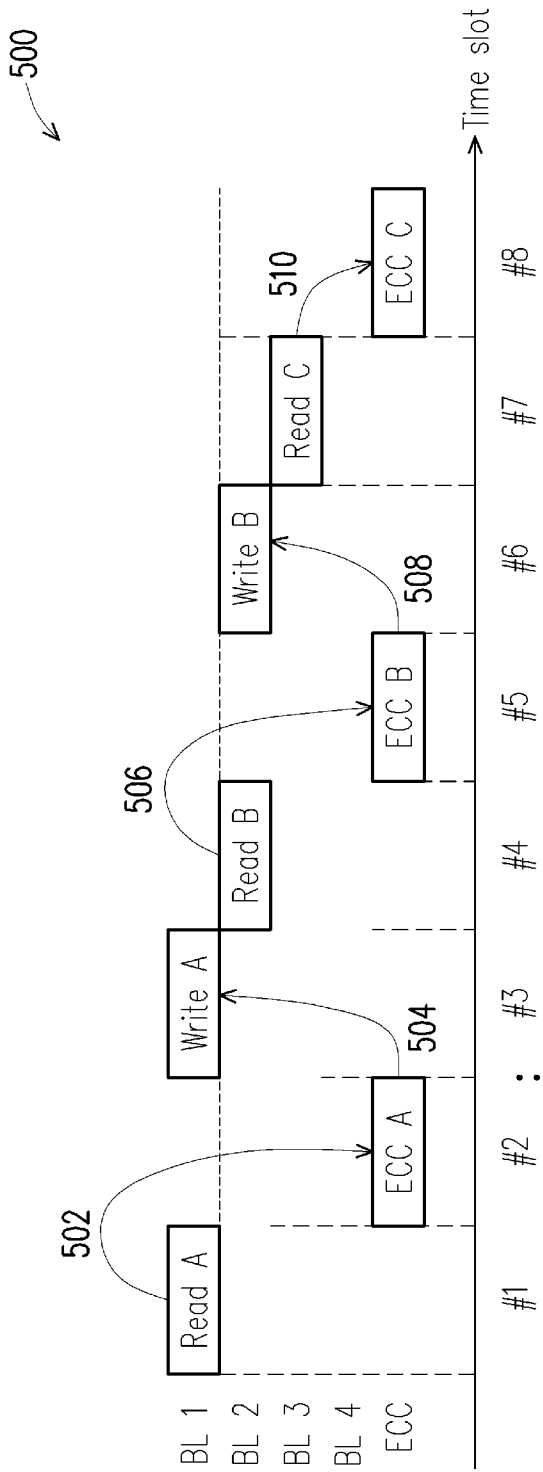
FIG. 5A illustrates a process flow for the method for performing the refresh operation without address rotation in accordance with some embodiments.

FIG. 5A illustrates an example process flow 500 for performing the refresh operation without address rotation in accordance with some embodiments. The refresh operation starts with a selected cell of cell array 102. For example, and as shown in FIG. 5A, in a first time slot, the data from the cell A of the cell array 102 is read. After reading the data from the cell A in the first time slot, an error check on the data read from the cell A is performed (arrow 502) in a second time slot. After performing the error check in the second time slot, the data read from the cell A is written back to the cell A in a third time slot (arrow 504).

After re-writing the data in the cell A, process flow 500 continues to a next cell. For example, and as shown in FIG. 5A, in a fourth time slot, a data stored in the cell B of cell array 102 is read. After reading the data from the cell B in the fourth time slot, an error check on the data read from the cell B is performed (arrow 506) in a fifth time slot. After performing the error check in the fifth time slot, the data read from the cell B is written back to the cell B (arrow 508) in a sixth time slot.

After re-writing the data in the cell B, process flow 500 continues to a next cell. For example, and as shown in FIG. 5, in a seventh time slot, a data stored in the cell C is read. After reading the data from the cell C in the seventh time slot, an error check on the data read from the cell C is performed (arrow 510) in a eighth time slot. After performing the error check in the eighth time slot, the data read from the cell C is written back to the cell C in a next time slot (for example, a ninth time slot (not shown)). Process flow 500 can continue till each of the selected cells of cell array 102 are re-written. In addition, process 500 can be repeated after a predetermined amount of time from a last refresh operation.

Figure 5B:
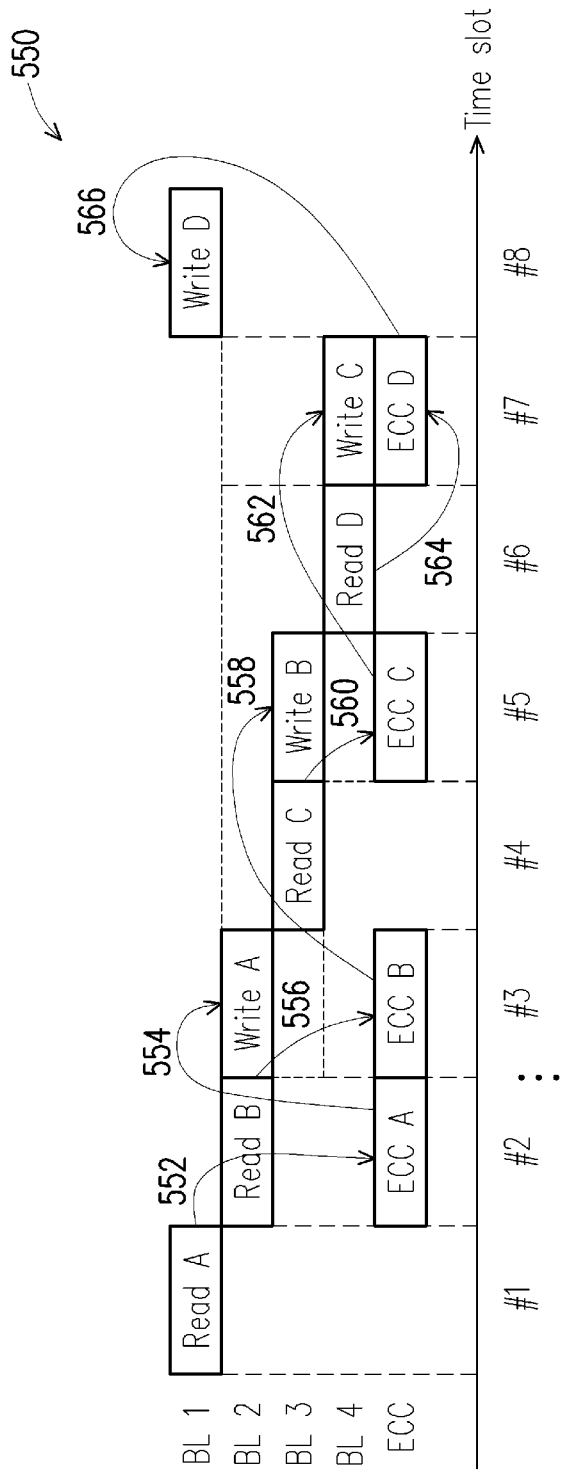
FIG. 5B illustrates a process flow for the method for performing the refresh operation with address rotation in accordance with some embodiments.

FIG. 5B illustrates an example process flow 550 for performing the refresh operation with address rotation in accordance with some embodiments. The refresh operation with address rotation starts with a selected cell of cell array 102. For example, and as shown in FIG. 5B, in a first time slot, the data from the cell A of cell array 102 is read. After reading the data from the cell A in the first time slot, the data from a next cell (that is, the cell B) is read in a second time slot. In addition, substantially simultaneously with reading the data from the cell B, an error check is performed on the data read from the cell A (arrow 552) in a second time slot. That is, reading the data from the cell B and performing an error check on the data read from the cell A are performed in parallel in the second time slot.

After reading the data from the cell B and performing the error check for the data read from the cell A in parallel in the second time slot, the data read from the cell A is written to another cell (for example, the cell B) of cell array 102 (arrow 554) in a third time slot. In addition, substantially simultaneously with re-writing of the data read from the cell A to the cell B, an error check is performed on the data read from the cell B (arrow 556) in the third time slot. That is, the re-writing of the data read from the cell A and performing an error check on the data read from the cell B are performed in parallel in the third time slot.

After re-writing the data read from the cell A and performing the error check for the data read from the cell B, process flow 550 continues to a next cell of cell array 102. For example, and as shown in FIG. 5B, in a fourth time slot, a data stored in the cell C of cell array 102 is read. After reading the data from the cell C in the fourth time slot, the data read from the cell B is written to another cell (for example, the cell C) of cell array 102 (arrow 558) in a fifth time slot. In addition, substantially simultaneously with re-writing of the data read from the cell B, an error check is performed on the data read from the cell C (arrow 560) in the fifth time slot. That is, the re-writing of the data read from the cell B and performing an error check on the data read from the cell C are performed in parallel in the fifth time slot.

After re-writing the data read from the cell B and performing the error check for the data read from the cell C, process flow 550 continues to a next cell of cell array 102. For example, and as shown in FIG. 5B, in a sixth time slot, a data stored in the cell D of cell array 102 is read. After reading the data from the cell D in the sixth time slot, the data read from the cell C is written to another cell (for example, the cell D) of cell array 102 (arrow 562) in a seventh time slot. In addition, substantially simultaneously with re-writing of the data read from the cell C, an error check is performed on the data read from the cell D (arrow 564) in the seventh time slot. That is, the re-writing of the data read from the cell C and performing an error check on the data read from the cell D are performed in parallel in the seventh time slot.

After performing the error check of the data read from the cell D in parallel with re-writing of the data read from the cell C, in an eighth time slot the data read from the cell D is written to another cell (that is, the cell A) (arrow 566). In example embodiments, the rotation pattern may be modified according to the need. For example, the data read from the cell A may be rotated to the cell C, the data read from the cell B may be rotated to the cell D, and so on. It is not limited thereto.

Figure 6:
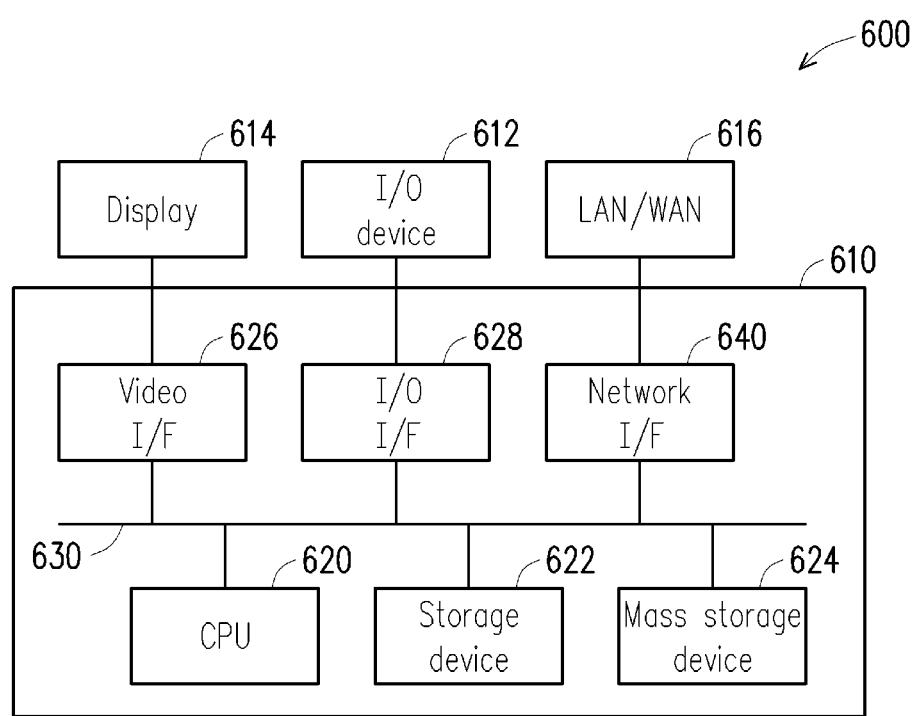
FIG. 6 is a block diagram illustrating an example of a processing system in accordance with some embodiments.

FIG. 6 is a block diagram illustrating an example of a processing system 600 in accordance with some embodiments disclosed herein. Processing system 600 may be used to implement memory refresh operations in accordance with various processes discussed herein. Processing system 600 includes a processing unit 610, such as a desktop computer, a workstation, a laptop computer, a dedicated unit customized for a particular application, a smart phone or tablet, etc. Processing system 600 may be equipped with a display 614 and one or more input/output devices 612, such as a mouse, a keyboard, touchscreen, printer, etc. Processing unit 610 also includes a central processing unit (CPU) 620, storage device 622, a mass storage device 624, a video adapter 626, and an I/O interface 628 connected to a bus 630.

The bus 630 may be one or more of any type of several bus architectures including a memory bus or memory controller, a peripheral bus, or video bus. CPU 620 may comprise any type of electronic data processor, and storage device 622 may comprise any type of system memory, such as static random access memory (SRAM), dynamic random access memory (DRAM), or read-only memory (ROM).

Mass storage device 624 may comprise any type of storage device configured to store data, programs, and other information and to make the data, programs, and other information accessible via bus 630. Mass storage device 624 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. Storage device 622 and mass storage device 624 are computer storage media examples (e.g., memory storage).

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by processing device 600. Any such computer storage media may be part of processing device 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Video adapter 626 and I/O interface 628 provide interfaces to couple external input and output devices to processing unit 610. As illustrated in FIG. 6, examples of input and output devices include display 614 coupled to video adapter 626 and I/O device 612, such as a mouse, keyboard, printer, and the like, coupled to I/O interface 628. Other devices may be coupled to processing unit 610, and additional or fewer interface cards may be utilized. For example, a serial interface card (not shown) may be used to provide a serial interface for a printer. Processing unit 610 also may include a network interface 640 that may be a wired link to a local area network (LAN) or a wide area network (WAN) 616 and/or a wireless link.

Embodiments of processing system 600 may include other components. For example, processing system 600 may include power supplies, cables, a motherboard, removable storage media, cases, and the like. These other components, although not shown, are considered part of processing system 600.

In some examples, instructions or software code is executed by CPU 620 to perform refresh operations. The instructions or the software code may be accessed by CPU 620 via bus 630 from storage device 622, mass storage device 624, or the like, or remotely through network interface 640. Further, in some examples, the refresh operations instructions may be received through I/O interface 628 and/or stored in storage device 622 or mass storage device 624 in accordance with various methods and processes implemented by the software code.

In accordance with example embodiments, a method of refreshing a memory device, comprises: reading first data stored in a first cell of a cell array in a first time slot; performing an error check for the first data in a second time slot; reading, substantially simultaneously with performing the error check for the first data in the second time slot, second data stored in a second cell of the cell array; performing the error check for the second data in a third time slot; and writing, substantially simultaneously with performing the error check for the second data in the third time slot, the first data to the second cell.

In example embodiments of the disclosure, an apparatus comprises: a storage medium; and a processor connected to the storage medium, wherein the processor is operative to: perform a refresh operation without address rotation in a cell array, and perform, after performing the refresh operation without address rotation, a refresh operation with address rotation in the cell array.

In accordance with example embodiments, a memory device comprises: a cell array; a sense amplifier connected to the cell array; a buffer connected to the sense amplifier; and a controller connected to the cell array, wherein the controller is operative to: perform a refresh operation without address rotation in the cell array, repeat performing the refresh operation without address rotation for a predetermined number of times, and perform, after repeating performing the refresh operation with address rotation for the predetermined number of times, a refresh operation with address rotation in the cell array.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of refreshing a memory device, comprising:
   reading first data stored in a first cell of a cell array in a first time slot;
   performing an error check for the first data in a second time slot;
   reading, substantially simultaneously with performing the error check for the first data in the second time slot, second data stored in a second cell of the cell array;
   performing the error check for the second data in a third time slot; and
   writing, substantially simultaneously with performing the error check for the second data in the third time slot, the first data to the second cell.

2. The method of claim 1, further comprising storing, after performing the error check for the first data, the first data in a buffer.

3. The method of claim 1, wherein performing the error check for the first data comprises:
   determining that the first data is corrupted; and
   correcting, in response to determining that the first data is corrupted, the first data.

4. The method of claim 1, further comprising:
   reading, in a fourth time slot, a third data stored in a third cell.

5. The method of claim 4, further comprising:
   performing the error check for the third data in a fifth time slot; and
   writing, substantially simultaneously with performing the error check for the third data in the fifth time slot, the second data to the third cell.

6. The method of claim 5, further comprising:
   reading, in a sixth time slot, a fourth data stored in a fourth cell.

7. The method of claim 6, further comprising:
   performing the error check for the fourth data in a seventh time slot; and
   writing, substantially simultaneously with performing the error check for the fourth data in the seventh time slot, the third data to the fourth cell.

8. The method of claim 7, wherein the first time slot, the second time slot, the third time slot, the fourth time slot, the fifth time slot, the sixth time slot, and the seventh time slot are continuous time slots.

9. The method of claim 7, wherein the first cell, the second cell, the third cell, and the fourth cell are connected to a first word line of the cell array, and wherein the first cell is connected to a first bit line, the second cell is connected to a second bit line, the third cell is connected to a third bit line, and the fourth cell is connected to a fourth bit line.

10. An apparatus comprising:
    a storage device; and
    a processor connected to the storage device, wherein the processor is configured to:
       read first data stored in a first cell of a cell array in a first time slot;
       perform an error check for the first data in a second time slot;
       store, after performing the error check for the first data, the first data in a buffer;
       read, substantially simultaneously with performing the error check for the first data in the second time slot, second data stored in a second cell of the cell array;
       perform the error check for the second data in a third time slot; and
       write, substantially simultaneously with performing the error check for the second data in the third time slot, the first data to the second cell.

11. The apparatus of claim 10, wherein the processor being configured to perform the error check for the first data comprises the processor being configured to:
    determine that the first data is corrupted; and
    correct, in response to determining that the first data is corrupted, the first data.

12. The apparatus of claim 10, wherein the processor being further configured to:
    read, in a fourth time slot, a third data stored in a third cell.

13. The apparatus of claim 12, wherein the processor being further configured to:
    perform the error check for the third data in a fifth time slot; and
    write, substantially simultaneously with performing the error check for the third data in the fifth time slot, the second data to the third cell.

14. The apparatus of claim 13, wherein the processor being further configured to:
    read, in a sixth time slot, a fourth data stored in a fourth cell.

15. The apparatus of claim 14, wherein the processor being further configured to:
    perform the error check for the fourth data in a seventh time slot; and
    write, substantially simultaneously with performing the error check for the fourth data in the seventh time slot, the third data to the fourth cell.

16. The apparatus of claim 15, wherein the first time slot, the second time slot, the third time slot, the fourth time slot, the fifth time slot, the sixth time slot, and the seventh time slot are continuous time slots.

17. A memory device comprising:
    a cell array; and a controller connected to the cell array, wherein the controller is configured to perform a refresh operation without address rotation in the cell array, wherein the controller being configured to perform the refresh operation without address rotation in the cell array comprises the controller being configured to:
  read first data stored in a first cell of the cell array in a first time slot;
  perform an error check for the first data in a second time slot;
  read, substantially simultaneously with performing the error check for the first data in the second time slot, second data stored in a second cell of the cell array;
  perform the error check for the second data in a third time slot; and
  write, substantially simultaneously with performing the error check for the second data in the third time slot, the first data to the second cell.

18. The memory device of claim 17, wherein the controller being configured to perform the error check for the first data comprises the controller being configured to:
  determine that the first data is corrupted; and
  correct, in response to determining that the first data is corrupted, the first data.

19. The memory device of claim 17, wherein the controller being further configured to:
  store, after performing the error check for the first data, the first data in a buffer.

20. The memory device of claim 17, wherein the controller being further configured to:
  repeat performing the refresh operation without address rotation for a predetermined number of times.

* * * * *